US008005141B2

United States Patent
He et al.

(10) Patent No.: US 8,005,141 B2
(45) Date of Patent: Aug. 23, 2011

(54) METHOD FOR EFFICIENT ENCODING AND DECODING QUANTIZED SEQUENCE IN WYNER-ZIV CODING OF VIDEO

(75) Inventors: Dake He, Yorktown Heights, NY (US); Vadim Sheinin, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 1399 days.

(21) Appl. No.: 11/458,473

(22) Filed: Jul. 19, 2006

(65) Prior Publication Data

US 2008/0019443 A1 Jan. 24, 2008

(51) Int. Cl.
*H04N 7/12* (2006.01)
(52) U.S. Cl. .................................. 375/240.03
(58) Field of Classification Search .............. 375/240.03
See application file for complete search history.

(56) References Cited

OTHER PUBLICATIONS

The International Search Report issued by the International Search Authority in relation to the related British application on Sep. 27, 2007, pp. 1 to 9 Westerlamen et al. "The Role of the Virtual Channel in Distributed Source Coding of Video", Image Processing, 2005, ICIP 2005, IEEE International COnference on Genova, Italy, Sep. 11-14, 2005, pages.
Madhurima Potluri "Distributed Source Coding Using Non Binary LDPC", Master thesis, Wisweswaraiah Technological University, India, Dec. 2005, pp. 1-49 Liveris etal. "A distributed Source Coding Technique for Correlated Images Using Turbo-codes", IEEE Communications Letters, IEEE Service Ceter Piscataway, NJ, US, vol. 6, No. 9, Sep. 2002, pp. 379-381.
Rane et al. "Systematic Lossy Forward Error Protection for Error-Resilient Digital Video Broadcasting", Proceedings of the SPIE, Bellingham, VA, US, vol. 5308, No. 1, Jan. 20, 2004, pp. 588-595 Avudainayagam et al., "A Hyper-Trellis Based Turbo Decoder for Wyner-Ziv Video Coding", IEEE St.Loius, MO, USA Nov. 28-Dec. 2, 2005, IEEE, Nov. 28, 2005, pp. 1414, right-hand column, line 8-42.
Puri et al., A New Robust Video Coding Architecture Based on Distributed Compression Principles, Proceedings of the Annual Allerton Conference on Communication, Control and Computing, XX,XX, 2002, pp. 586-595 Quan Xu et al., "Layered Wyner-Ziv Coding", Proceedings of the spie, VA, US, V.5308, n1, pp. 83-91.
Sandeep Pradhan et al. "Distributed Source Coding Using Syndromes (DISCUS): Design and Construction", IEEE Transactions on Information Theory, IEEE Service Center, Piscataway , vol. 49, No. 3, Mar. 2003.

*Primary Examiner* — Y. Lee
*Assistant Examiner* — Richard Torrente
(74) *Attorney, Agent, or Firm* — Whitham, Curtis, Christofferson & Cook, P.C.; Stephen C. Kaufman

(57) ABSTRACT

A computer-based method for encoding and decoding quantized sequences in Wyner-Ziv coding of video, bi-partite graph is used in an iterative process. The method takes as input to an encoder a sequence of quantized data from a finite alphabet, the sequence comprising a video frame. Another sequence of data, decoded from the prior video frame, is input to a decoder. A statistical model describing the statistical relationship between the quantized input sequence to the encoder and the input sequence to the decoder is input to both the encoder and the decoder. A minimum field size is estimated from the statistical model at the encoder and the decoder separately.

1 Claim, 5 Drawing Sheets

METHOD FOR EFFICIENT ENCODING AND DECODING QUANTIZED SEQUENCE IN WYNER-ZIV CODING OF VIDEO

BACKGROUND OF THE INVENTION

1. Field of the Invention

The present invention relates generally to methods and apparatuses for video compression. More specifically, the present invention describes a method for efficient encoding and encoding quantized sequences in video compression systems based on the principle of coding with side information available only at the decoder, hereafter referred to as Wyner-Ziv video coding systems.

2. Background Description

Conventional video compression systems, as standardized by MPEG, rely on a complex, sophisticated encoder that exploits the statistical correlation among neighboring video frames to achieve good compression performance. In emerging applications like video surveillance, mobile multimedia, video conferencing, video gaming, and battlefield video communications, however, a simple, low-cost encoder with low computational complexity is instead desired. In an effort to reduce encoding computational complexity, one approach proposed recently is to apply the principle of Wyner-Ziv coding to shift the computational load from the encoder to the decoder.

Briefly speaking, in Wyner-Ziv coding, the decoder has access to side information that is not available to the encoder; and such side information can still be exploited to achieve greater compression than would otherwise be possible. Therefore, with the objective to achieve very low encoding complexity, Wyner-Ziv video coding systems exploit the statistical correlation among neighboring video frames only at the decoder, and thus relieve the encoder of significant computational load.

FIG. 2 shows a typical Wyner-Ziv video compression system. In general, a Wyner-Ziv video compression system consists of a video encoder 235 which compresses (or encodes) a video signal 205 into a compressed video frame 255, and a video decoder 245 which decompresses (or decodes) the compressed video frame 255 to produce reconstructed video frame 275. At any time instant, a video frame V 205 is to be encoded by the encoder 235. Since the decoder 245 has access to the previously decoded frame 285, it can generate prior knowledge 290 about V 205 from the previously decoded frame 285, and use this knowledge in the decoding process 250. Being aware of the existence of the prior knowledge 290 about V 205 at the decoder 245, the encoder 235 can transmit fewer bits, and thus achieve greater compression, than would otherwise be possible.

A brief description of the typical encoding process is as follows. The encoder first compresses V 205 conventionally by using a discrete cosine transform (DCT) 210, and quantization 220 (equivalent to the intra mode transform and quantization in MPEG coding). The resultant signal x 225 is called the quantized sequence, and takes value in a discrete set.

Previous methods for encoding 230 the quantized sequence x 225 have been described by Pradhan and Ramchandran, *Distributed source coding using syndromes (DISCUS): design and construction*, IEEE Transactions on Information Theory, 2003, Aaron and Girod, *Wyner-Ziv video coding with low-encoder complexity*, Proc. Picture Coding Symposium, PCS 2004, San Francisco, Calif., 2004, Xu and Xiong, *Layered Wyner-Ziv video coding*, Proc. VCIP'04: Special Session on Multimedia Technologies for Embedded Systems, San Jose, Calif., 2004, Sehgal, Jagmohan, and Ahuja, *A state-free video encoding paradigm*, Proc. IEEE Int. Conf. Image Processing, 2003, and, Puri and Ramchandran, *PRISM: A new robust video coding architecture based on distributed compression principles*, Proc. of 40th Allerton Conference on Communication, Control, and Computing, Allerton, Ill., 2002.

The general process of encoding 230 the quantized sequence x 225 adopted in these methods is shown in FIG. 3. More specifically, in these methods, the signal x 225 is first binarized 310 into a set of binary streams 315. Correspondingly, the statistical model 240 representing the statistical relationship between x 225 (at the encoder 235) and y 295 (at the decoder 245) is decomposed 350 into a set of binary models 355, each of which corresponds to a binary stream 315 obtained from x 225. From each binary model 355, a binary code (e.g. 320, 330, . . . 360) is then generated, and used to encode the corresponding binary stream 315.

The chief drawback of these methods is that the binarization 310 of x 225 and the decomposition 350 of the statistical model 240 add computational complexity to encoding, and complicate the code generation process. The additional encoding computational complexity is particularly undesirable as the main objective of Wyner-Ziv video compression systems is to reduce encoding complexity.

Note that although the side information y 295 is not assumed on the encoder side, the encoder 235 needs to know the statistical relationship between x 225 and y 295 as reflected in the statistical model 240 in order to encode x 225. For the purpose of reducing encoding complexity, the statistical model should be estimated by using computationally efficient methods in Wyner-Ziv video compression systems. The description of such methods, however, is not relevant to the present invention. Hence, we shall simply assume that the statistical model 240 is known at the encoder 235 and at the decoder 245.

SUMMARY OF THE INVENTION

The present invention is therefore directed to a method for encoding the quantized sequence x directly.

Another object of the invention is to effectively eliminate the need for binarizing x and decomposing the statistical model.

A further object of the invention is to further reduce the encoding complexity in the overall Wyner-Ziv video compression systems.

The present invention is directed to a computer-based method for encoding and decoding quantized sequences in Wyner-Ziv coding of video transmissions. The method estimates a minimum field size from a given statistical model of a relationship between a quantized sequence of a current video frame and side information obtained from previous video frames decoded from previously encoded quantized sequences. Using the statistical model, the method encodes a quantized sequence x into a syndrome sequence z and decodes the quantized sequence x from syndrome sequence z and the side information. The encoding is done without access to the side information, and both the encoding and the decoding portions of the method are each able to separately construct a statistical model that is the same as the given statistical model.

On the encoding side, the method takes as input to an encoder a sequence x of quantized data from a finite alphabet and a statistical model about x. A minimum field size M is estimated from the statistical model. According to the statistical model, a bipartite graph G is constructed, having variable nodes and check nodes, in which the alphabet A of each check node is a finite field of size M. In response to the quantized sequence x fed into the variable nodes of G, the method generates a sequence z from alphabet A at the check nodes of G. The sequence z is termed the syndrome of x in G. This syndrome sequence z is the output of the encoder to be transmitted. Since the length of z is often smaller than that of x, compression is achieved.

On the decoding side of the present invention, the method takes as input to a decoder a syndrome sequence z received in transmission, a sequence y of quantized data from the previously decoded video frames, and a statistical model representing the statistical relationship between y and the sequence x to be decoded. A minimum field size N is estimated from the statistical model. According to the statistical model, a bipartite graph G is constructed, having variable nodes and check nodes, in which the alphabet A of each variable node and each check node is a finite field of size M. Taking the sequence y as the initial input to the variable nodes of G, the method uses an iterative process to decode the sequence x as a sequence from alphabet A whose syndrome sequence is z in G. If no such sequence is found within a prescribed threshold number of iterations, the method declares a decoding failure. In one aspect of the invention, the iterative process uses the statistical model to successively modify the input to the variable nodes of G, up to the prescribed threshold number of iterations, until the sequence output at the check nodes is equal to the syndrome sequence z. When the output at the check nodes is equal to the syndrome sequence z, then the iterated input sequence at the variable nodes is taken to be the reconstructed quantized sequence. In another aspect of the invention successive iterations to the input to the variable nodes are determined by the belief propagation method generalized to a finite field of size M.

The sequence x above is the quantized output 225 in a Wyner-Ziv video coding system as shown in FIG. 2. The sequence y above is the side information sequence 295 reconstructed at the decoder in a Wyner-Ziv video coding system as shown in FIG. 2.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 4:
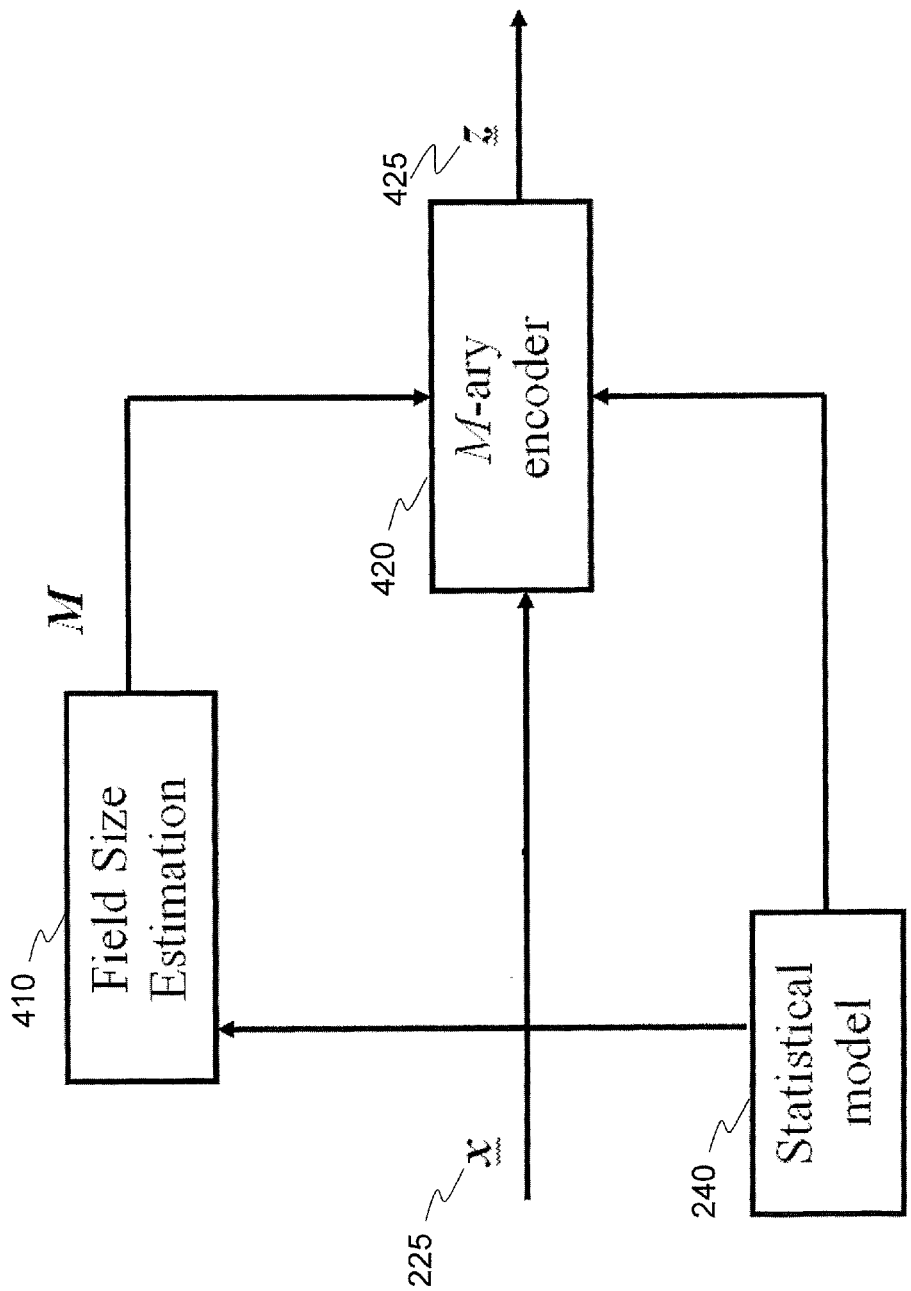
FIG. 4 is a diagram illustrating the improved method of encoding quantized sequence x in a Wyner-Ziv coding system.
Figure 5:
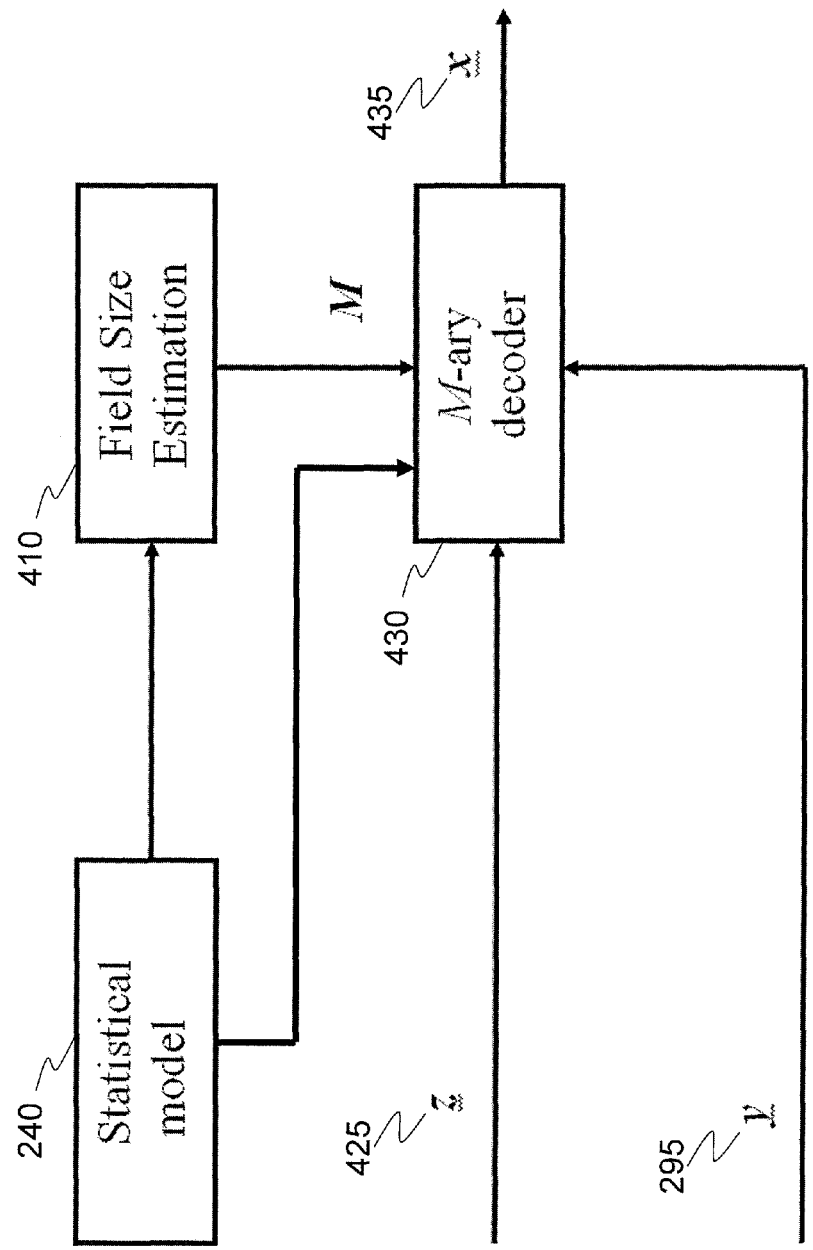
FIG. 5 is a diagram illustrating the improved method of decoding quantized sequence K in a Wyner-Ziv coding system.

The encoding side and decoding side of the method of the present invention are shown in FIGS. 4 and 5, respectively.

Figure 3:
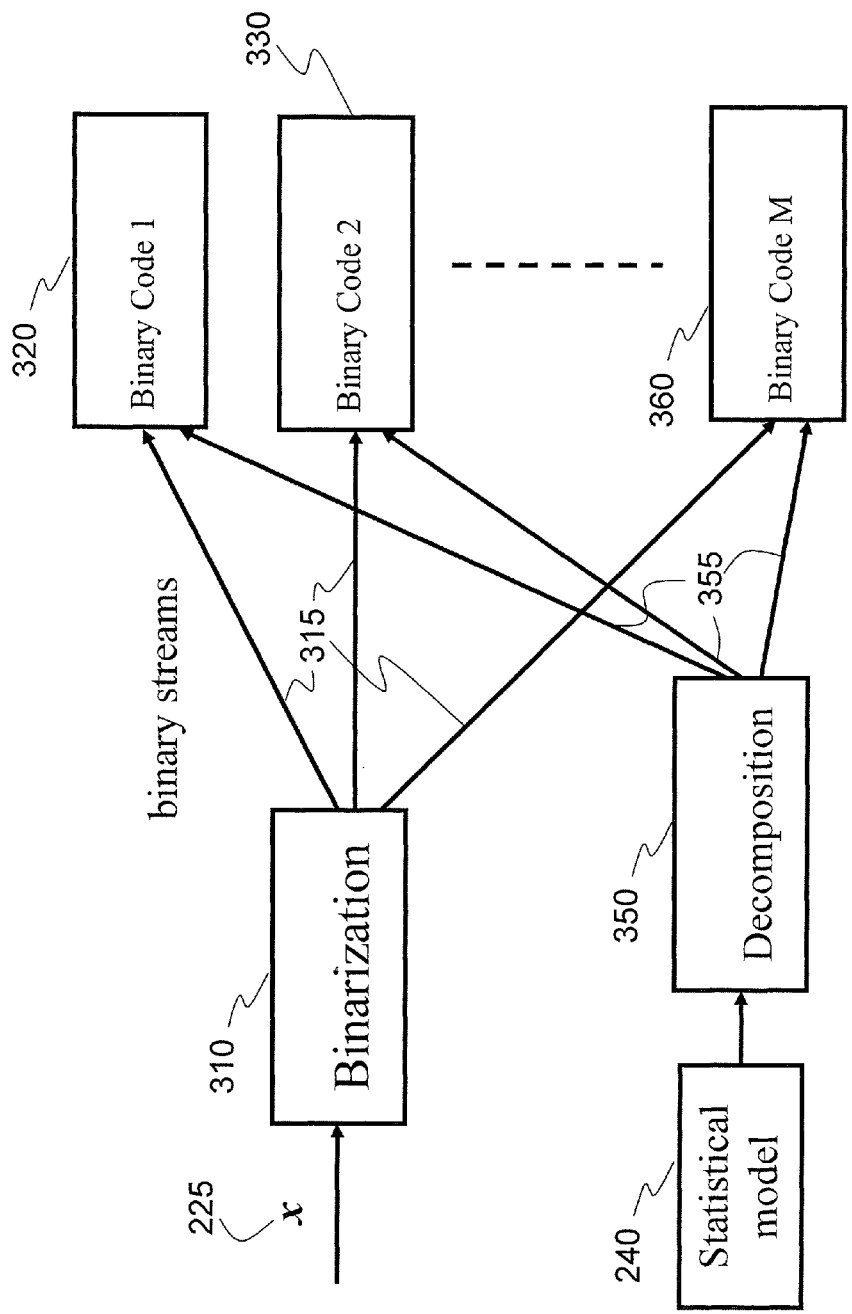
FIG. 3 is a diagram illustrating a conventional method of encoding quantized sequence K involving binarization, decomposition of a statistical model, and a series of binary codes.

In contrast to prior art encoding as illustrated in FIG. 3, the improved encoding of the present invention as shown in FIG. 4 first estimates 410 a field size M from the statistical model 240, then generates an M-ary code 420 from the same statistical model 240 to encode the quantized sequence x directly into a binary sequence z 425.

Figure 1:
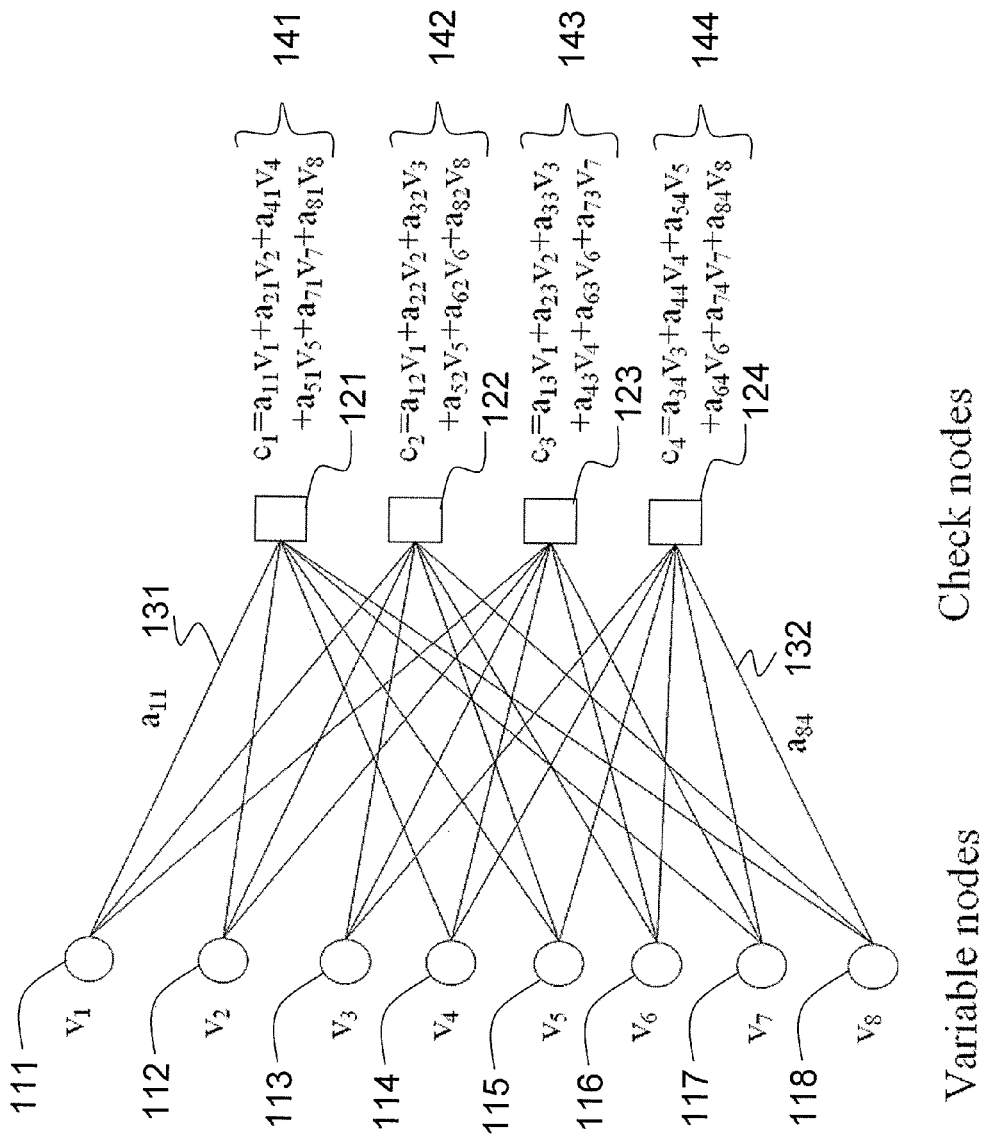
FIG. 1 is a diagram illustrating a bipartite graph as used in the invention.

To illustrate the encoding process, let us look at FIG. 1. FIG. 1 shows an example of a bipartite graph where on the left hand side of an edge (e.g. items 131 and 132) is a variable node (circle-shaped), and on the right hand side of an edge is a check node (square-shaped). Each variable node carries a value, for example, $v_i$ for the $i^{th}$ variable node (counted from top to bottom, items 111 to 118), where i denotes an integer between 1 and 8. Similarly, each check node carries a value, for example, $c_j$ for the $j^{th}$ check node (counted from top to bottom, items 121 to 124), where j denotes an integer between 1 and 4. An edge in a bipartite graph may also carry a value, for example, $a_{ij}$ for the edge connecting the $i^{th}$ variable node and the $j^{th}$ check node. For example, edge $a_{11}$ 131 represents the value associated with the component of $v_1$ in $c_1$, and edge $a_{84}$ 132 represents the value associated with the component of $v_8$ in $c_4$.

In the example shown in FIG. 1, each $c_i$ is related to a subset of $\{v_1, v_2, \ldots, v_8\}$ through a linear equation (e.g. 141 to 144) defined over a finite field A. For example, as shown in FIG. 1, $$c_1 = a_{11}v_1 + a_{21}v_2 + a_{41}v_4 + a_{51}v_5 + a_{71}v_7 + a_{81}v_8.$$

To see how $c_1$ is calculated, let us suppose that $v_1=6$, $v_2=3$, $v_4=5$, $v_5=10$, $v_7=1$ and $v_8=0$, and that $a_{ij}=1$ for all (i, j) pairs appearing in the above equation. Suppose also that the finite field A is GF(4) consisting of 4 elements 0, 1, 2, and 3. To perform the arithmetic in GF(4), we need to first map the integer set from which $v_1 v_2 \ldots v_8$ is drawn to A (equivalently, GF(4)). A common mapping method is to use modular arithmetic. Hence, $v_1=2$ (mod 4), $v_2=3$ (mod 4), $v_4=1$ (mod 4), $v_5=2$ (mod 4), $v_7=1$ (mod 4), and $v_8=0$ (mod 4). Then according to finite field arithmetic defined over GF(4), $$c_1 = (2+3) + (1+2) + (1+0) = 1+3+1 = 3.$$

Note that GF(4) arithmetic field operations (addition '+' and multiplication '*') are defined by the following two tables.

| + | 0 | 1 | 2 | 3 |
|---|---|---|---|---|
| 0 | 0 | 1 | 2 | 3 |
| 1 | 1 | 0 | 3 | 2 |
| 2 | 2 | 3 | 0 | 1 |
| 3 | 3 | 2 | 1 | 0 |

| * | 0 | 1 | 2 | 3 |
|---|---|---|---|---|
| 0 | 0 | 0 | 0 | 0 |
| 1 | 0 | 1 | 2 | 3 |
| 2 | 0 | 2 | 3 | 1 |
| 3 | 0 | 3 | 1 | 2 |

If the field size of A is M, we say the bipartite graph describes an M-aray (linear) code. In response to a length 8 sequence $v_1 v_2 \ldots v_8$ input to the variable nodes, the M-ary code given by the bipartite graph in FIG. 1 encodes the sequence into a length 4 sequence $c_1 c_2 c_3 c_4$ output by the check nodes. The sequence $c_1 c_2 c_3 c_4$ is termed the syndrome sequence of $v_1 v_2 \ldots v_8$.

Suppose that each symbol in the field A is represented by log(M) bits, where "log" denotes the logarithm function to base 2 throughout this document. Since m is generally much smaller than n, compression is achieved. The resulting compression rate in bits per symbol is (mlog(M))/n. In practice, the encoder 420 selects m and M according to the length of the input sequence x and the expected compression rate estimated from the statistical model 240. The estimation is performed for each frame to be encoded. Note that once M is chosen, the encoder 420 knows how to choose m to achieve the desired compression rate.

A video sequence 205 typically consists of integer numbers (ranging, say, from 0 to 255"). After DCT transform 210 and quantization 220, quantized sequence x 225 is another sequence of integer numbers (typically with a larger range). This sequence is encoded by using the above described method. Say, for example, a number 13 is to be encoded and the field size is 4. We can use modulo 4 operation to convert 13 into 1. The M-ary encoding operations 420 are then performed arithmetically in finite field GF(4) to produce syndrome sequence z 425. Compression is achieved since the number of bits used to represent the syndrome sequence z is often much less than the number bits used to represent the input quantized sequence.

In this invention, the field size M to be used to generate an M-ary code is estimated from the statistical model 240. Specifically, suppose that the alphabet of the quantized sequence x is an integer set. The estimation process seeks a subset of M integers such that the probability (determined by the statistical model 240) of x containing symbols outside the size M subset is smaller than a prescribed threshold. To facilitate computation in different computing platforms, one may also want to constrain the selection of M to satisfy certain properties, for example, being an integral power of two.

Figure 2:
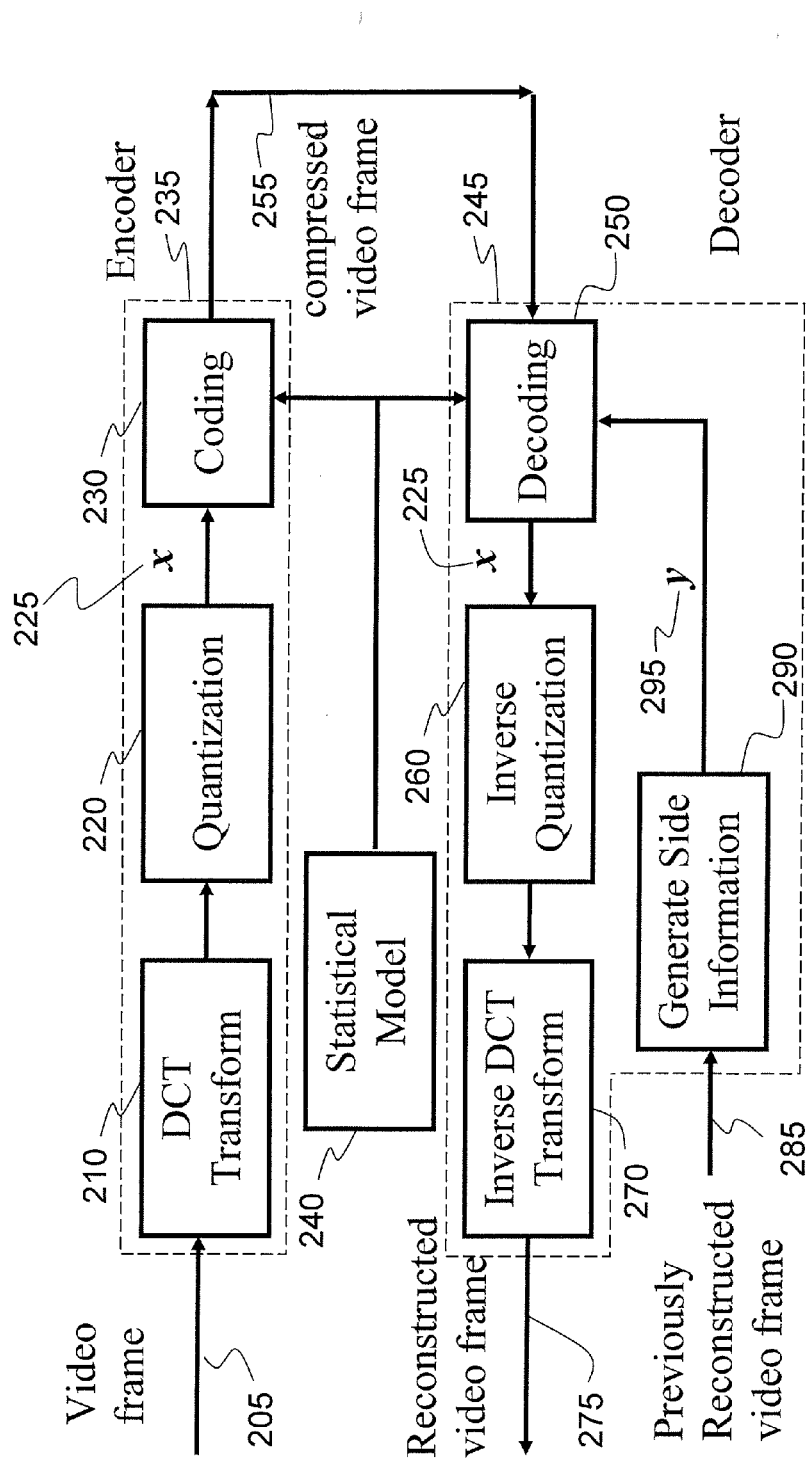
FIG. 2 is a diagram illustrating a typical Wyner-Ziv coding system.

On the decoder 430 side, the improved method shown in FIG. 5 generates an M-ary code given by a bipartite graph from the statistical model 240, and then uses the same M-ary code to decode 430 quantized sequence x 435 from the sequences z 425 and y 295, the latter of which is generated for input to the decoder 430 from the previously decoded frames, for example, in the same manner as in the prior art shown in FIG. 2.

Note that, in principle, the encoder 420 and decoder 430 may be distant from one another. By matching the learning method and the data used to learn the model, we can make sure that the encoder 420 and the decoder 430 are using the same statistical model 240 and, thus, generate the same bipartite graph. Assuming a given statistical relationship, there are various ways to learn the relationship in practice. One such way is to use a portion of the video frames for the learning.

In general, an M-ary code described by a bipartite graph with n variable nodes and m check nodes can be used to encode any sequence of length n into its syndrome sequence of length m. The value of n is given by the input sequence x, whereas m is determined from the statistical model 240. For any pair (n,m), the encoder 420 and the decoder 430 generate the same bipartite graph (hence, the same code) from the statistical model 240.

The decoding rule can be either the MAP (maximum a posteriori) decoding rule or its approximations. By using the MAP decoding rule, the decoder tries to find the most probable sequence given y (that is, most probable according to the statistical model 240) whose syndrome sequence is equal to z in the generated bipartite graph.

Enforcing the MAP decoding rule is computationally expensive. An alternative is to approximate the MAP decoding rule by using an iterative decoding process. The process can be described as follows. Let G denote the bipartite graph describing the M-ary code 420 generated from the statistical model 240.

Step 1: Initialize a counter k as 1. Let $v^{(k)}$ denote the sequence in the variable nodes of G at the $k^{th}$ iteration. Initialize $v^{(1)}$ as y.

Step 2: Calculate the syndrome sequence of $v^{(k)}$ in G. If the syndrome sequence is equal to z, the process terminates; otherwise, the decoder finds a new sequence $v^{(k+1)}$ according to the statistical model and G. One possible method in determining the new sequence $v^{(k+1)}$ is the well-known belief propagation method generalized to a finite field of size M.

Step 3: Increase the counter k by one. If k is greater than a prescribed threshold, the process terminates; otherwise, go to Step 2.

At the end of the above iterative process, the decoder outputs x as $v^{(k)}$. Note that if the above iterative process terminates with a sequence $v^{(k)}$ whose syndrome sequence is NOT z in G, the decoder detects a decoding failure.

It should be noted that use of the bi-partite graph provides a computationally effective methodology for iterative decoding, and is therefore the best mode of implementing the invention. However, in principle, the invention is also operable for any M-ary linear code H, where H is an m by n matrix from a finite field with M elements and where the encoder calculates z=Hx.

While the invention has been described in terms of a single preferred embodiment, those skilled in the art will recognize that the invention can be practiced with modification within the spirit and scope of the appended claims.

The invention claimed is:

1. A method for encoding and decoding quantized sequences according to a Wyner-Ziv encoding, comprising steps of:
   providing a statistical model of a quantized video sequence of video frames to an encoder;
   providing said statistical model of a quantized video sequence of video frames to a decoder;
   receiving a quantized sequence of video frames, each frame having symbols encoded at a given n bits per symbol;
   estimating a minimum M-ary field size M, based on said statistical model;
   constructing, based on the statistical model, a bi-partite encoding graph G having a set of variable nodes arranged for receiving a corresponding subset of consecutive n-bit symbols from a video frame from among said quantized sequence of video frames, and having m check nodes, wherein said constructing constructs said check nodes to output symbols represented in an alphabet A having log (M) bits per symbol according to given log (M) polynomial functions of said subset of consecutive n-bit symbols;
   encoding a quantized sequence x of video frames into a syndrome sequence z representing compressed video frames, said syndrome sequence z having symbols encoded at mLog(M) bits per symbol, where m is a given value, said step of encoding including inputting subsets of consecutive n-bit symbols of said quantized sequence of video frames to said variable nodes of said bi-partite encoding graph G;
   decoding said syndrome sequence z, at said decoder, into a decoded sequence y representing a decompression of said quantized sequence of video frames, wherein said step of decoding includes:
   constructing at the decoder, from said statistical model provided to the decoder, a decoder bi-partite graph, wherein said step of constructing at the decoder is arranged such that, based on said statistical model provided to said encoder and to said decoder, the constructed decoder bi-partite graph is functionally identical to said bi-partite encoding graph G,
initializing a counter value k,
setting a decoding sequence based on said counter value k,
calculating a syndrome sequence in said decoder bi-partite graph that would be generated by said decoded sequence y,
identifying whether said calculated syndrome sequence is equal to said syndrome sequence z and, if said calculated syndrome sequence is not equal to said syndrome sequence z, then incrementing said counter value k and repeating said steps of setting, calculating and identifying until any one of the following termination conditions is identified: (i) said calculated syndrome sequence is equal to z and (ii) no valid value of k results in said calculated syndrome sequence being equal to said syndrome sequence z; and
outputting said decoded sequence y if said termination condition (i) is identified, and outputting a decoder failure data if termination condition (ii) is identified.

* * * * *